June 20, 1961

S. J. ANGELLO 2,989,424

METHOD OF PROVIDING AN OXIDE PROTECTIVE COATING FOR SEMICONDUCTORS

Filed March 31, 1958

WITNESSES:

Bernard R. Gieguez

Charles T. Board

INVENTOR

Stephen J. Angello

BY

William G. Eddins

ATTORNEY

United States Patent Office 2,989,424

Patented June 20, 1961

2,989,424

METHOD OF PROVIDING AN OXIDE PROTECTIVE COATING FOR SEMICONDUCTORS

Stephen J. Angello, Pittsburgh, Pa., assignor to Westinghouse Electric Corporation, East Pittsburgh, Pa., a corporation of Pennsylvania Filed Mar. 31, 1958, Ser. No. 725,306
6 Claims. (Cl. 117—200)

This invention relates to semiconductor devices and particularly to protective surface treatment of semiconductor devices of the junction type to avoid undesired conducting paths.

It is recognized in the art that degradation of the performance of semiconductor devices takes place during the operation thereof owing to the presence of leakage paths or channels on or near the surface of the semiconductive body.

Several theories have been advanced to explain the existence of these leakage paths. Without necessarily subscribing to any of the theories advanced regarding these leakage paths, it can be said that the existence of leakage paths is attributable to a reversal of conductivity type at the surface or edge of a layer of one conductivity type, for example an N-type surface layer on the edge of the P-type layer of an N-P-N junction. This N-type layer is established on the surface of the exposed surface of the P-type layer by the adsorption of hydrogen ions (H+) made available by reaction between the semiconductive body and moisture present on its surface.

To eliminate these undesired leakage paths on the surface of semiconductor devices, it has been proposed to apply to at least the surface of the P-type zone a surface coating comprising an oxidizing agent such as red lead ($Pb_3O_4$) and a resinous composition such as an epoxy resin or a mixture of polyethylene and polyisobutylene.

The resinous composition serves to maintain the oxidizing agent in homogeneous contact with the surface of the semiconductive body during operation of the semiconductor device.

The oxidizing agent provides for inhibition of the hydrogen forming reaction and the complete removal of hydrogen adsorbed during the cleaning process by furnishing oxygen for adsorption on the surface of the semiconductive body. The surface is thereby converted from an unstable N-type to the desired stable P-type as a result of the replacement of hydrogen ions by oxygen ions.

While the above described surface coating has proved satisfactory for semiconductor devices which comprise germanium semiconductive bodies and which operate at temperatures of about 100° C. and lower, such surface coating has not proved satisfactory for silicon semiconductor devices which operate at considerably higher temperatures.

Semiconductor devices embodying silicon semiconductive bodies operate at temperatures of about 180° C. and higher. Oftentimes a silicon semiconductor device is subjected to temperatures of about 300° C. for short periods of time. Thus, the resinous composition comprising the surface coating above described will melt, decompose or otherwise be adversely affected at these high temperatures, which in turn will adversely affect the proper functioning of the silicon semiconductor device. "Sudden death" failures of silicon semiconductor devices having applied thereto a surface coating as above described have been attributed to the slow decomposition of the resinous composition employed.

It is desirable to have available in the art a protective surface coating for silicon semiconductor devices and the like which will prevent or substantially eliminate the formation of the undesired leakage paths and which coating will not be adversely affected by the high operating temperatures of the silicon semiconductor body and thereby not adversely affect the proper functioning of the semiconductor body to which it is applied.

The object of this invention is to provide on the surface of semiconductor devices an adherent protective coating of certain specific metal oxides.

A further object of this invention is to provide a silicon semiconductive body containing a P-N junction and having on at least the surfaces of the P-type zone a protective coating of red lead ($Pb_3O_4$), which protective coating has good adherence thereto.

Another object of this invention is to provide a method for applying to the surfaces of a semiconductive body a protective coating of certain specific finely divided metal oxides, which method provides on the surface of the semiconductor device an adherent protective coating of the metal oxide.

Other objects of this invention will, in part, be obvious and will, in part, appear hereinafter.

For a better understanding of the nature and objects of this invention, reference should be had to the following detailed description and drawing, in which.

Figure 1:
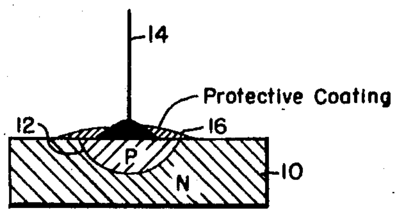
FIGURE 1 is a view in cross section of a semiconductor device of the diode type.

In accordance with this invention, it has been discovered that adherent protective coatings of red lead ($Pb_3O_4$) can be provided on the surfaces of semiconductive bodies such as germanium and silicon. This is accomplished without resorting to a resinous binder or any other type of binder to maintain the red lead in intimate contact with the surface of the semiconductive body. Red lead will be referred to throughout this specification; however, it is to be understood that this invention is not limited to coatings of red lead alone, and that coatings of zinc chromate ($ZnCrO_4$) and strontium chromate ($SrCrO_4$) and mixtures of two or more of these compounds may be employed with good results. The oxidizing agent employed will be in finely divided form and preferably in the form of powder.

Briefly, the method of this invention comprises admixing red lead powder with a volatile vehicle to produce a slurry, which slurry is applied to the surfaces of the semiconductive body as a coating by any well known method such as painting, spraying, dipping and the like.

The semiconductive body with the applied slurry coating is allowed to remain at room temperature for a few minutes so as to permit substantially complete removal of the volatile vehicle by evaporation thereof. The semiconductive body is heated to high temperatures for a period of time. It is believed, that during this heating, oxygen from the red lead is adsorbed on the surface of the semiconductive body and the surface is thereby converted from an unstable N-type to the desired stable P-type by the replacement of hydrogen ions by oxygen ions. The protective coating assists in maintaining this desired stable P-type surface condition during the operation of the semiconductive device.

During the heating step the fine particles of red lead coalesce to produce a substantially uniform protective coating on the surface of the semiconductive body. The heating will ordinarily remove any volatile vehicle that is still present in the coating. It is desirable that the volatile vehicle be completely removed. However, should small amounts remain in the protective coating, it will have no adverse effects on the proper functioning of the semiconductor device as long as the volatile vehicle is substantially pure.

The volatile vehicle employed in admixture with the red lead powder is one that is substantially pure and one that will leave no residue upon evaporation. Any residue remaining after evaporation will adversely affect the proper functioning of the semiconductor device. Suitable volatile vehicles are the transistor grade alcohols such as absolute methyl alcohol, absolute ethyl alcohol and absolute isopropyl alcohol. Mixtures of two or more may be employed.

It has been found that suitable paintable slurries can be prepared by thoroughly admixing, by weight, one part of powdered red lead with from about 0.5 part to 1.5 parts of volatile vehicle.

The slurry thus prepared is applied to the surfaces of the semiconductive body to be protected and allowed to dry for about five minutes during which time a substantial amount of the volatile vehicle is removed by evaporation. It is important that no heat be applied to speed up the removal of the volatile solvent at this point. Application of substantial heat will cause the volatile solvent to boil out of the slurry. This boiling condition will cause the coating to sputter off the semiconductive surface and the resulting coating will be unsatisfactory for the purpose of this invention. Although the drying may be accomplished at atmospheric conditions, it is preferred to accomplish this drying operation in the protective atmosphere of a dry container which preferably should not be above about 20% relative humidity at 25° C. Thereafter, while the coated semiconductor device is still in the dry container, the semiconductor device is heated to a temperature of from about 150° C. to 250° C. for a period of time of from about one-half hour to two hours depending on the temperature employed. The semiconductor device is removed from the container and cooled to room temperature.

The semiconductor device is thus provided with an adherent protective coating of red lead. Any loose red lead powder remaining on the surface of the semiconductor device can be easily removed, if desired, by shaking the semiconductor device and causing the loose powder to fall off. Just why the protective coating of red lead adheres so well to the semiconduction surface is not fully understood. It is believed that the molecular attraction between the red lead and silicon cause this good adherence to exist.

The coated semiconductor device thus produced may be hermetically sealed in a suitable container if desired.

Thus, in accordance with this invention, there is applied to a semiconductor device a highly satisfactory protective coating of red lead, which coating consists essentially of red lead that adheres to the surface of the semiconductive body without the aid of a bonding agent to maintain the red lead powder in contact with the semiconductive body.

Referring to FIG. 1 of the drawing there is shown a semiconductor device of the diode type. The device comprises a zone 10 of N-type material and a zone 12 of P-type material. A connection 14 is shown made to the zone 12 of P-type material. Any suitable connection may be made to the N-type zone 10. A coating 16 of this invention is applied to the exposed surface of the P-type zone 12 and to a portion of the N-type zone 10, which coating prevents the formation of undesired leakage paths on or near the surface of the P-type zone 10.

Figure 2:
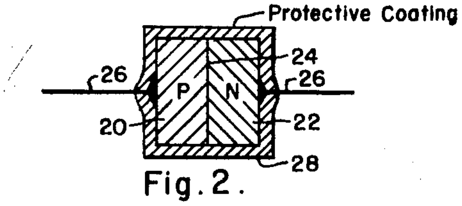
FIG. 2 is a view in cross section of a semiconductor device of the diode type.

FIG. 2 of the drawing is a longitudinal cross sectional view through a semiconductor device of the rectifier type. The device comprises a zone 20 of P-type material and a zone 22 of N-type material separated by barrier 24. Connections are made to each zone by wires 26 soldered to these zones. The entire body is encased in a red lead coating 28 of this invention and applied as hereinbefore set forth.

Figure 3:
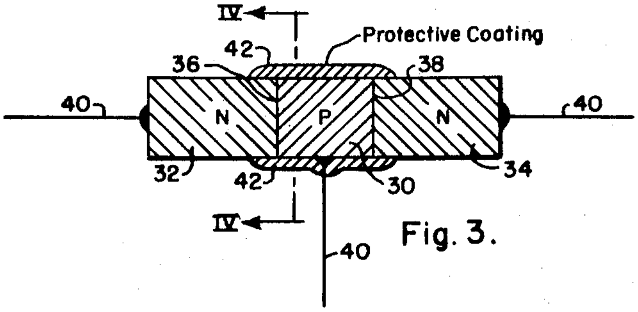
FIG. 3 is a view in cross section of a semiconductor device having an N-P-N type junction.

Referring to FIG. 3 of the drawing, there is shown a longitudinal cross section of a semiconductor device of the junction type. The device comprises a zone 30 of P-type material, such as germanium or silicon, interposed between two zones of 32 and 34 of N-type material of the same composition as that of the P-type zone 30, separated, respectively, by barriers 36 and 38. Connections are made to each zone by wires 40 soldered to these zones. A coating 42 of this invention is applied only on the surfaces of the P-type zone 30 and a portion of the adjacent N-type zones 32 and 34.

Figure 4:
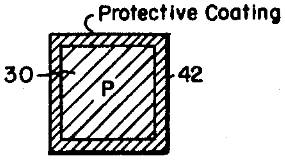
FIG. 4 is a view along the line IV—IV of FIG. 3.

FIG. 4 of the drawing is a section taken along line IV—IV of FIG. 3 through the P-type zone 30 to show the adherence of the coating 42 to the entire periphery of the P-type zone 30.

It is to be understood that the semiconductor device should present a proper surface prior to the application of the coating of this invention. Thus, the material may be subjected to any of the chemical or electrolytic etching techniques known to the art, followed by rinsing in high purity water and thorough drying. Thorough drying is usually carried out in a container that is substantially dry. The coating of this invention is most conveniently accomplished while the dry semiconductor device is maintained within the protective dry atmosphere.

While the protective coating of this invention is particularly applicable for silicon semiconductor devices, it is not limited to such application and may be used as a protective coating on other semiconductive bodies such, for example, as germanium.

The protective coating of this invention may be applied to the entire surface of the semiconductive body as shown in FIG. 2 of the drawing. However, it is only essential that it be applied to at least the exposed surfaces of the P-type zone as shown in FIG. 1 of the drawing. Also some overlapping of the coating onto the N-type zone should result so as to insure complete coverage of the surface of the P-type zone.

The following example is illustrative of this invention. The semiconductor device treated is a silicon semiconductor device of the diode type similar to that as described with reference to FIG. 1 of the drawing.

*Example I*

A slurry is prepared by thoroughly admixing 20 grams of red lead powder with 20 grams of absolute methyl alcohol (transistAR grade).

A coating of the slurry is applied to the surface of the P-type zone and to a portion of the surface of the adjacent N-type zone to insure complete coverage of the P-type zone. The slurry is applied while the semiconductor device is in a dry container dehumidified to a dew point of about −60° C. Substantially all the methyl alcohol will evaporate in a period of about five minutes. The silicon semiconductor device is then heated to a temperature of about 200° C. by means of a hot plate positioned in the dry container, and maintained at this temperature for about one-half hour. Any remaining methyl alcohol is removed during this time. The semiconductor device with the applied coating of red lead is cooled to room temperature in the dry container and then removed.

Several hundred silicon semiconductor diodes have been treated in the manner of Example I. These silicon semiconductor devices have proved highly satisfacory in use.

The leakage current that exist in semiconductor devices provided with the protective coating of this invention has been substantially reduced. Thus, for example, an untreated silicon diode with a given applied voltage will have a leakage current of the order of one milliamp. By applying the protective coating of this invention this one milliamp. leakage will be reduced to from 0.1 milliamp. to 0.01 milliamp.

By employing the protective coating of this invention, the satisfactory operation of such treated semiconductor device is not dependent upon the unpredictable high temperature stability of a resinous composition.

It is to be understood that the above description and drawing are illustrative and not in limitation of the invention.

I claim as my invention:

1. A semiconductor body having a P-N junction and having on at least the surface of the P-type zone an adherent protective coating consisting only of at least one oxidizing agent selected from the group consisting of red lead, zinc chromate and strontium chromate.

2. A semiconductor body having a P-N junction and having on at least the surface of the P-type zone an adherent protective coating consisting only of read lead, which coating provides for a substantial reduction in current leakage paths.

3. A silicon semiconductor diode having a P-N junction and having on at least the surface of the P-type zone an adherent protective coating consisting only of at least one oxidizing agent selected from the group consisting of red lead, zinc chromate and strontium chromate, which coating provides for a substantial reduction in current leakage paths.

4. A silicon semiconductor diode having a P-N junction and having on at least the surface of the P-type zone an adherent protective coating consisting only of red lead, which coating provides for a substantial reduction in current leakage paths.

5. In the method of providing an adherent protective coating on the surface of a semiconductor body having a P-N junction, the steps which consist of applying to at least the surface of the P-type zone a coating of a slurry consisting of at least one finely divided oxidizing agent selected from the group consisting of red lead, zinc chromate and strontium chromate and a volatile vehicle selected from the group consisting of absolute methyl alcohol, absolute ethyl alcohol and absolute isopropyl alcohol, removing substantially all the volatile vehicle by evaporation, and heating the semiconductor body with applied coating in a dehumidified atmosphere to a temperature of from about 150° C. to 250° C. for a period of time of from about one-half hour to two hours whereby there is provided on the surface of the semiconductive body a protective coating having good adherence to the surface of the semiconductor body.

6. In the method of providing an adherent protective coating on the surface of a silicon semiconductor diode having a P-N junction, the steps which consist of applying to at least the surface of the P-type zone a coating of a slurry consisting of red lead and absolute methyl alcohol, removing substantially all the volatile vehicle by evaporation, and heating the semiconductor body with applied coating in a dehumidified atmosphere to a temperature of from about 150° C. to 250° C. for a period of time of from about one-half hour to two hours whereby there is produced on the surface of the semiconductor body a protective coating having good adherence to the surface of the semiconductor body.

References Cited in the file of this patent

UNITED STATES PATENTS

| | | |
|---|---|---|
| 2,794,846 | Fuller | June 4, 1957 |
| 2,816,850 | Haring | Dec. 17, 1957 |